(12) United States Patent
Rowe

(10) Patent No.: US 9,497,886 B2
(45) Date of Patent: Nov. 15, 2016

(54) AIR COOLING

(75) Inventor: Adrian Rowe, Isle of Wight (GB)

(73) Assignee: BAE SYSTEMS plc, London (GB)

( * ) Notice: Subject to any disclaimer, the term of this patent is extended or adjusted under 35 U.S.C. 154(b) by 505 days.

(21) Appl. No.: 13/512,794

(22) PCT Filed: Nov. 18, 2010

(86) PCT No.: PCT/GB2010/051919
§ 371 (c)(1),
(2), (4) Date: May 30, 2012

(87) PCT Pub. No.: WO2011/067581
PCT Pub. Date: Jun. 9, 2011

(65) Prior Publication Data
US 2012/0227930 A1 Sep. 13, 2012

(30) Foreign Application Priority Data

Dec. 2, 2009 (EP) .................................... 09275120
Dec. 2, 2009 (GB) .................................. 0921100.4

(51) Int. Cl.
*G05D 23/00* (2006.01)
*H05K 7/20* (2006.01)

(52) U.S. Cl.
CPC .......... *H05K 7/20145* (2013.01); *H05K 7/206* (2013.01); *H05K 7/207* (2013.01);
(Continued)

(58) Field of Classification Search
CPC .......... F24F 7/08; F24F 11/012; F24F 11/053; F24F 12/001; F24F 13/062; F24F
(Continued)

(56) References Cited

U.S. PATENT DOCUMENTS 3,870,227 A   3/1975 Attridge, Jr.
4,325,716 A * 4/1982 Livemore ...................... 96/378
(Continued)

FOREIGN PATENT DOCUMENTS

CH    664 093 A5    2/1988
DE    43 30 925 A1  3/1995
(Continued)

OTHER PUBLICATIONS

International Search Report dated Feb. 23, 2011 issued in PCT/GB2010/051919.
(Continued)

*Primary Examiner* — Len Tran
*Assistant Examiner* — Gordon Jones
(74) *Attorney, Agent, or Firm* — Scully, Scott, Murphy & Presser, PC

(57) ABSTRACT

The present invention relates to air cooling of equipment and is more particularly, although not exclusively, concerned with the use of air at ambient temperature to effect cooling of electronic equipment. Accordingly, there is provided ambient air cooling apparatus comprising: a chamber in which items to be cooled are located; an air inlet; at least one air outlet; at least one fan for drawing air from said air inlet, through said chamber and over the items to be cooled, and to said at least one air outlet; a heater for heating air within said cooling apparatus; and a controller for controlling the operation of said heater and said at least one fan.

7 Claims, 6 Drawing Sheets

(52) U.S. Cl.
CPC ...... *H05K 7/20209* (2013.01); *H05K 7/20572* (2013.01); *H05K 7/20618* (2013.01)

(58) Field of Classification Search
CPC ............... 2003/1632;H05K 7/20745; H05K 7/20145; H05K 7/20572; H05K 7/206; H05K 7/20609; H05K 7/20618; H05K 7/207
USPC ......... 62/97, 259.2, 277, 278; 165/119, 122, 165/126, 127, 23, 249, 250, 288, 291, 293, 165/294; 236/49.1; 361/679.5, 695; 454/236, 239, 251, 253
See application file for complete search history.

(56) References Cited

U.S. PATENT DOCUMENTS

| | | | |
|---|---|---|---|
| 4,336,040 A | | 6/1982 | Haberl |
| 4,495,545 A | | 1/1985 | Dufresne et al. |
| 4,860,163 A | | 8/1989 | Sarath |
| 5,409,419 A | * | 4/1995 | Euchner et al. ............... 454/184 |
| 5,791,408 A | * | 8/1998 | Seem ............................. 165/250 |
| 5,934,368 A | | 8/1999 | Tanaka et al. |
| 6,104,003 A | * | 8/2000 | Jones ............................. 219/400 |
| 6,105,875 A | * | 8/2000 | LaGrotta et al. ............ 236/44 A |
| 6,142,866 A | | 11/2000 | Wright |
| 6,700,780 B2 | * | 3/2004 | Hedberg ................. H05K 7/207 165/122 |
| 8,151,578 B1 | * | 4/2012 | Morales et al. .................... 62/91 |
| 8,270,154 B2 | * | 9/2012 | Andersen ........... H05K 7/20745 361/679.47 |
| 8,721,409 B1 | * | 5/2014 | Morales ............. H05K 7/20209 454/184 |
| 9,380,731 B2 | * | 6/2016 | Faig Palomer .... H05K 7/20163 |
| 2010/0027216 A1 | * | 2/2010 | Matsushima ...... H05K 7/20745 361/679.49 |
| 2011/0239683 A1 | * | 10/2011 | Czamara ........... H05K 7/20745 62/259.4 |
| 2015/0036293 A1 | * | 2/2015 | Martini ................ F24F 11/0001 361/695 |

FOREIGN PATENT DOCUMENTS

| | | |
|---|---|---|
| DE | 201 20 802 U1 | 3/2003 |
| EP | 1 988 760 A1 | 11/2008 |
| WO | WO 00/21372 A1 | 4/2000 |
| WO | WO 2006/058342 A2 | 6/2006 |

OTHER PUBLICATIONS

Extended European Search Report dated Nov. 11, 2010 issued in EP 09275120.5.
UK Search Report dated Jun. 3, 2010 issued in GB0921100.4.

* cited by examiner

AIR COOLING

The present invention relates to air cooling of equipment and is more particularly, although not exclusively, concerned with the use of air at ambient temperature to effect cooling of electronic equipment.

Cooling is required to maintain optimum operation of electronic equipment and it is well known to use refrigeration units to effect such cooling. In such cases, the refrigeration unit may use more energy than the equipment it is intended to cool.

According to one aspect of the present invention, there is provided ambient air cooling apparatus comprising: a chamber in which items to be cooled are located; an air inlet; at least one air outlet; at least one fan for drawing air from said air inlet, through said chamber and over the items to be cooled, and to said at least one air outlet; a heater for heating air within said cooling apparatus; and a controller for controlling the operation of said heater and said at least one fan.

The apparatus includes a filter attached to said air inlet for filtering the incoming air. Preferably, the filter comprises a cyclonic filter. Said cyclonic filter may also operate to mix heated air from said heater with air from said air inlet.

Optionally, said air inlet includes a baffle. A first sensor may be located adjacent said baffle for determining the temperature of air at said air inlet. A second sensor may be located in said chamber for determining the temperature of air in said chamber.

It is preferred that said air inlet includes an inlet shutter for controlling the ingress of air into the apparatus. Said inlet shutter may be powered and can be moved between a fully open position and a fully closed position.

In one embodiment of the present invention, four fans are provided for drawing air through the apparatus. Each fan has an associated backflow shutter that closes when the fan is non-operational.

Preferably, said fans are operated in pairs. A first pair of fans may be arranged to draw air through the apparatus to a first outlet. A second pair of fans may be arranged to draw air into an intermediate chamber connected to a second outlet and to a heater chamber in which said heater is mounted.

Said second pair of fans may be separated from said second outlet by an outlet shutter. Said outlet shutter may be powered and can be moved between one of four positions, a fully closed position, a fully open position, a first intermediate position and a second intermediate position.

Preferably, said second pair of fans is separated from said heater chamber by a bypass shutter. Said bypass shutter may be powered and can be moved between a fully closed position and a fully open position.

Advantageously, said controller is operable for receiving signals from said first and second sensors and for controlling said inlet shutter, said outlet shutter, said bypass shutter, said heater and said fans in accordance with said signals to effect optimal cooling of said items. Flow control means may also be provided within said chamber for balancing air flow over said items to be cooled.

In accordance with another aspect of the present invention, there is provided a method of cooling electronic equipment using ambient air, the method comprising the steps of: a) placing the equipment to be cooled in a chamber; b) drawing ambient air through the chamber using at least one fan; c) sensing the ambient air temperature at an air inlet and the temperature of the air in the chamber; d) adjusting the air flow through the chamber in accordance with the sensed ambient air temperature; e) heating the air within the chamber to prevent icing of the equipment if the ambient air temperature is below a predetermined temperature.

Preferably, the predetermined temperature is 5° C.

Using the apparatus and method in accordance with the present invention, effective cooling of items can be achieved without having to use refrigeration apparatus. This saves energy and reduces the size of the cooling apparatus.

For a better understanding of the present invention, reference will now be made, by way of example only, to the accompanying drawings in which.

The present invention will be described with reference to cooling of a radar array but it will be appreciated that it can be used for cooling of any suitable electrical or electronic equipment where the operating temperature of the equipment to be cooled is greater than the ambient air temperature. In the case of cooling a radar array, the ambient air temperature is considerably less than the operating temperature of the radar array which can be around 70° C.

The operation of the cooling system in accordance with the present invention when used with a radar system will be described in detail below with respect to different operation modes according to the ambient air temperature at the location where the radar system is located.

Figure 1:
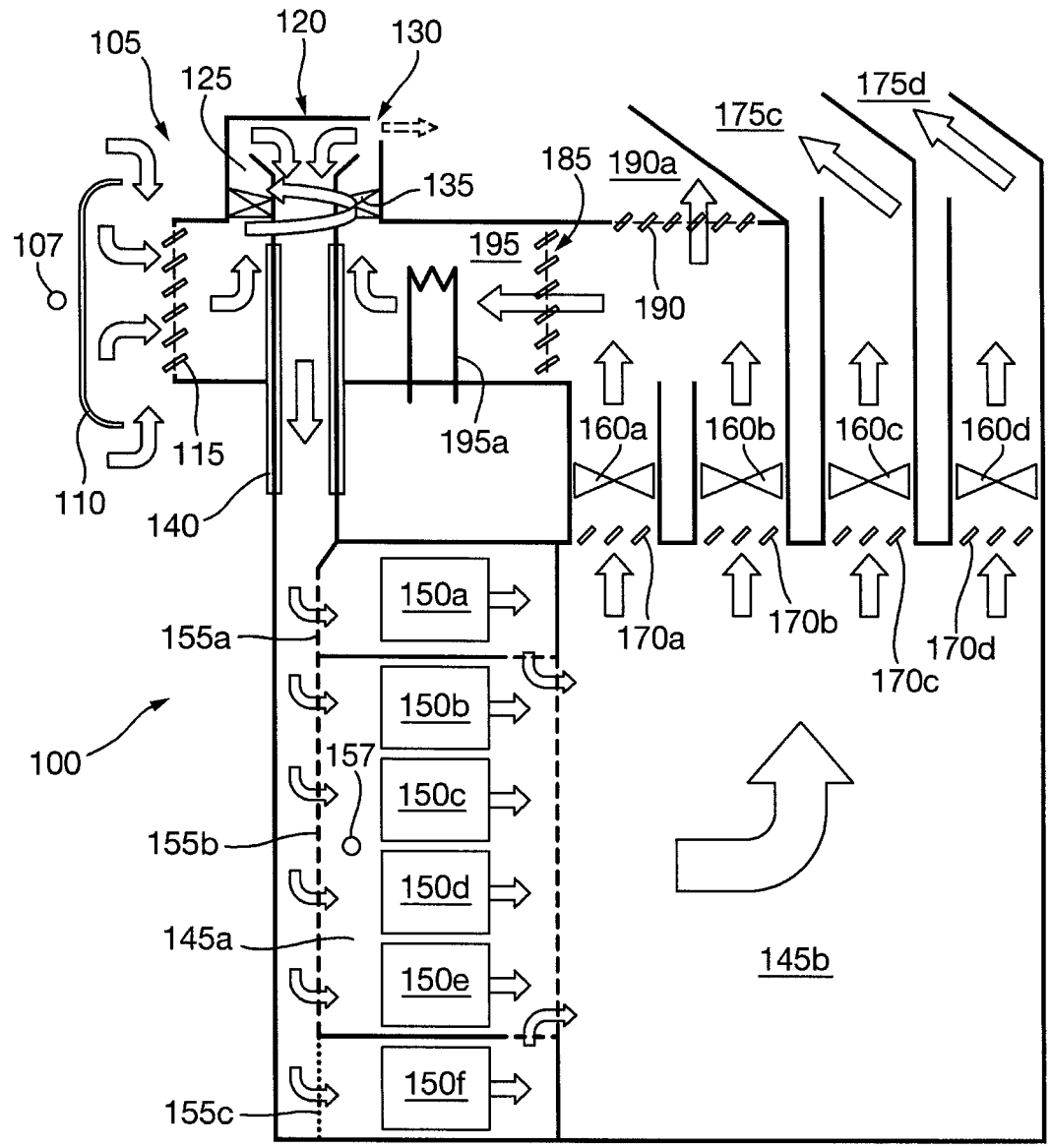
FIG. 1 illustrates a cooling system in accordance with the present invention.

Referring initially to FIG. 1, cooling apparatus 100 is shown. The apparatus 100 an air inlet 105 having a baffle 110 and an inlet shutter 115. The baffle 110 prevents air from directly entering the apparatus 100 and, with the air control shutter 115, controls the flow rate of air entering the apparatus 100. The inlet shutter 115 is powered so that it can be operated to move from a fully open position, allowing air to enter the apparatus 100, to a closed position, preventing air from entering the apparatus 100. These positions are not shown in FIG. 1 but are shown in the subsequent Figures.

The air inlet 105 is connected to an air cleaning system 120 which comprises a cyclonic filter 125 through which air is directed for cleaning. The air cleaning system 120 includes an outlet 130 through which debris that is removed from the air is ejected. The cyclonic filter 125 includes guide vanes 135 that create a vortex so that unwanted debris is removed from the air and ejected through the outlet 130.

A conduit 140 connects the air cleaning system 120 to a plenum chamber 145 in which the items to be cooled are located, for example, transmit/receive elements of a radar system that are referenced as 150*a*, 150*b*, 150*c*, 150*d*, 150*e* and 150*f*. The elements 150*a*, 150*b*, 150*c*, 150*d*, 150*e* and 150*f* are located in a first portion 145*a* of the plenum chamber 145 so that air is drawn over each element 150*a*, 150*b*, 150*c*, 150*d*, 150*e*, 150*f* to effect their cooling.

Naturally, air may be drawn through the elements 150*a*, 150*b*, 150*c*, 150*d*, 150*e*, 150*f* instead of over the elements if each element has cooling fins formed as an integral part of the element. In this case, the air is drawn through the element and over the cooling fins.

It will be appreciated that, although only one cyclonic filter 125 is illustrated in and described with reference to FIG. 1, more than one cyclonic filter can be utilised. In one embodiment of the present invention, there are four cyclonic filters 125 connected between the air inlet 110 and the plenum chamber 145.

The flow rate of air flowing to each of the elements 150a, 150b, 150c, 150d, 150e, 150f to be cooled is controlled by fixed inlets 155a, 155b and 155c. In this particular embodiment, elements 150a and 150f require different flow rates for cooling to that required by elements 150b, 150c, 150d, 150e and hence inlets 155a and 155c are different to inlet 155b so that the air flow over all the element is balanced correctly for optimal cooling.

Naturally, in other applications of the invention, each item to be cooled may require the same amount of air for cooling and in that case, inlets 155a, 155b and 155c may be a single inlet allowing air to flow at a particular flow rate.

Air from elements 150a and 150f rejoins the air from elements 150b, 150c, 150d and 150e via to exit the first portion 145a of the plenum chamber 145 via outlet 155 into a second portion 145b thereof.

The second portion 145b of the plenum chamber 145 houses four centrifugal fans 160a, 160b, 160c, 160d that draw air into the inlet 110, through the air cleaning system 120 and conduit 140, over the elements 150a, 150b, 150c, 150c, 150d, 150e, 150f in the first portion 145a of the plenum chamber 145, and into the second portion 145b of the plenum chamber 145.

Each fan 160a, 160b, 160c, 160d is located in a channel 165a, 165b, 165c, 165d and has a backflow shutter 170a, 170b, 170c, 170d, also located in channel 165a, 165b, 165c, 165d and associated therewith. Backflow shutters 170a, 170b, 170c, 170d are not powered and are opened by suction when associated fans 160a, 160b, 160c, 160d are operating. When a fan is not operating the associated backflow shutter is closed as there is no suction from the fan to keep the backflow shutter open.

The fans 160a, 160b, 160c, 160d are grouped together in pairs for operation, that is, fans 160a and 160b form a first pair that are operated together and fans 160c and 160d form a second pair that are operated together.

Channels 165c and 165d are connected to outlets 175c and 175d and fans 160c and 160d draw a portion of the air in the plenum chamber 145 out to the outlets 175c and 175d where the air is expelled to atmosphere.

Channels 165a and 165b are connected to a chamber 180 that is defined by a bypass shutter 185 and an outlet shutter 190. Outlet shutter 190 is connected to an outlet 190a so that when outlet shutter 190 is at least partially open, air is expelled to atmosphere.

Bypass shutter 185 is connected to a heating chamber 195 in which a thermostatically controlled heater 195a is located. Heating chamber 195 is also connected to air cleaning system 120 as shown.

The bypass shutter 185 is powered so that it can be operated to move from a fully open position, allowing air to enter heating chamber 195, to a fully closed position, preventing air from entering the heating chamber 195.

Exit shutter 190 is powered so that it can operate to move between a fully open position, a fully closed position and two intermediate partially open positions. The operation of the exit shutter 190 will be described in more detail with reference to FIGS. 2 to 4 below.

Although the exit shutter 190 is described as having only two intermediate positions, it will be appreciated that it can have any number of intermediate positions depending on the particular application.

The apparatus 100 also includes temperature sensors 107 and 157, shown schematically in FIG. 1. Sensor 107 is located near the inlet 110 to sense the temperature of the air being drawn into the apparatus 100. Sensor 157 is located in the first portion 145a of plenum chamber 145 between inlet 155b and the elements 150b, 150c, 150d, 150e to be cooled to sense the temperature of the air about to pass over the elements to be cooled.

The apparatus 100 also includes a control unit (not shown in FIG. 1) that controls the operation of the air control shutter 115, the fans 160a, 160b, 160c, 160d, and the heater 195a. The control unit also connected to temperature sensors 107 and 157 to use signals indicative of the air temperature at the inlet 110 and the first portion 145a of the plenum 145 for controlling the operation of the air control shutter 115, the fans 160a, 160b, 160c, 160d and the heater 195a.

In the embodiment shown in FIG. 1, electrical heater strips (shown schematically in FIG. 7 as 115a) are provided for anti-icing the air control shutter 115 when the ambient air temperature falls to a level at which the air control shutter 115 would ice up, for example, below 5° C. It may be advantageous that the heater 195a and the electrical heater strips on the air control shutter 115 operate in conjunction with one another.

All flow paths through the cooling apparatus 100 are indicated by block arrows.

In the particular embodiment of the invention, the air flow rate through the cooling apparatus 100 is controlled such that the flow rate through the exit shutter 190 is matched to the flow rate entering the air control shutter 115 as illustrated in and described with reference to FIGS. 3 and 4.

It will be appreciated that all component parts of the cooling apparatus 100 can be housed within a single housing (not shown) that surrounds the elements 150a, 150b, 150c, 150d, 150e, 150f to be cooled without affecting their performance.

The various modes of operation of the apparatus 100 will now be described with reference to FIGS. 2 to 5 in which components previously described with reference to FIG. 1 are numbered alike.

Figure 2:
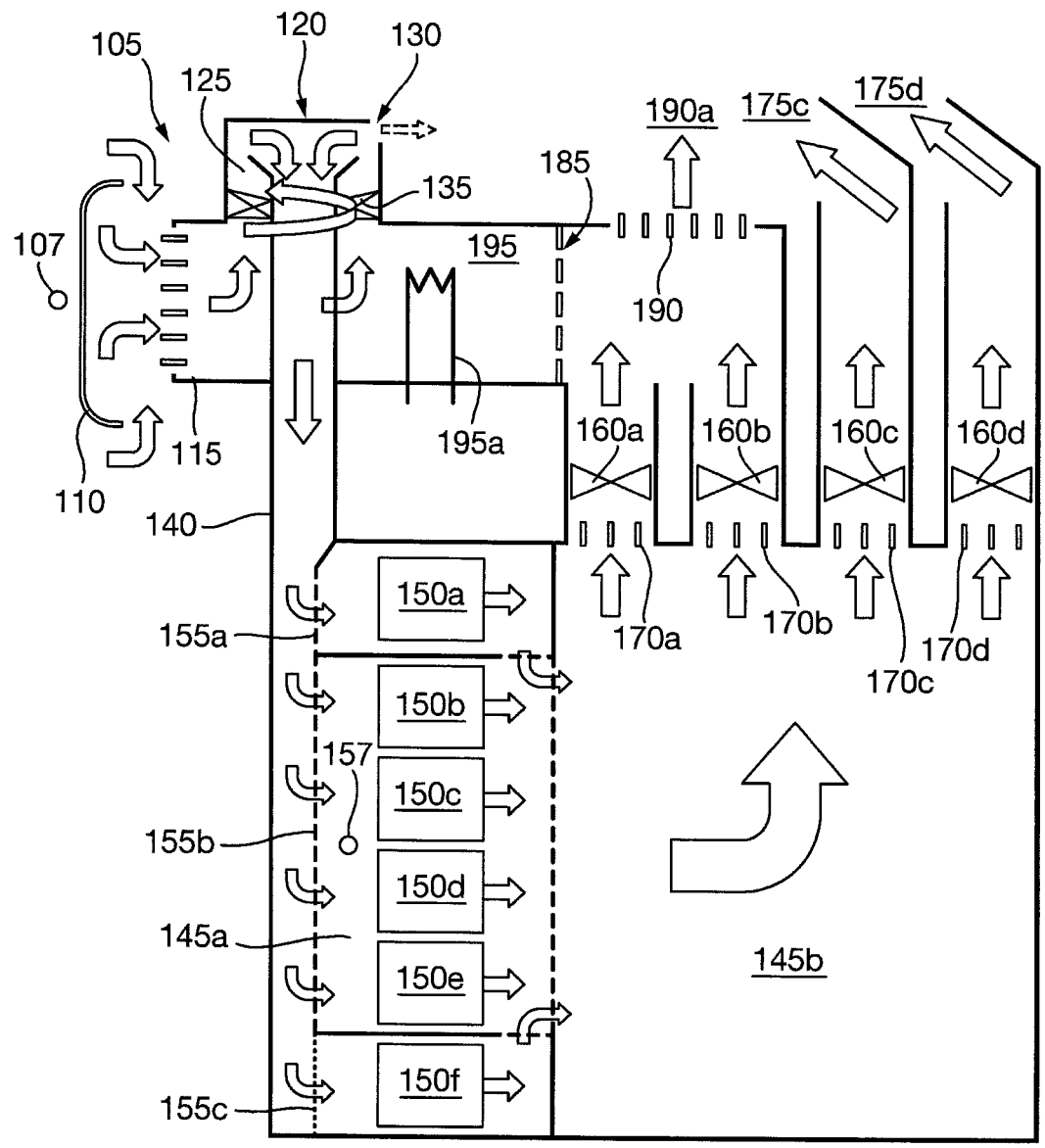
FIG. 2 illustrates the operation of the cooling system of FIG. 1 in a first mode of operation.

Referring now to FIG. 2, the cooling apparatus 100 is shown where the radar system is operating and the cooling apparatus operates in a first active mode of operation. Here, the ambient temperature is in the range of between 5° C. and 45° C. and the radar system is in a full transmit power mode. When the ambient temperature is above 5° C., there is no risk of the radar system or the cooling apparatus 100 suffering the problems associated with icing up.

In this mode, the heater 195a is off as there is no need to heat the air that is used for cooling as the air is at a temperature where no icing with occur. Here, all four fans 160a, 160b, 160c, 160d are operating and therefore the associated backflow shutters 165a, 165b, 165c, 165d are also in the fully open position. Air is drawn into the air cleaning system 120, through the conduit 140, into the plenum chamber 145 and out through outlets 175c, 175d, 190a as exit shutter 190 is fully open. Inlet shutter 115 is fully open to maximise the amount of air being drawn into the apparatus 100. Bypass shutter 185 is fully closed so that no air is diverted through the heating chamber 195 and all the air being drawn through channels 170a, 170b by fans 160a, 160b passes to outlet 190a via the fully open exit shutter 190.

An example of the total air flow rate through the cooling apparatus 100 is 1.0 m³s⁻¹ and the air temperature sensed by sensor 157 in plenum 145 is approximately the same as the air temperature sensed by sensor 107 at the inlet 105, that is, between 5° C. and 45° C.

Where the air temperature is below 5° C., the cooling apparatus 100 operates in the second and third modes of operation as will be described with reference to FIGS. 3 and 4.

Figure 3:
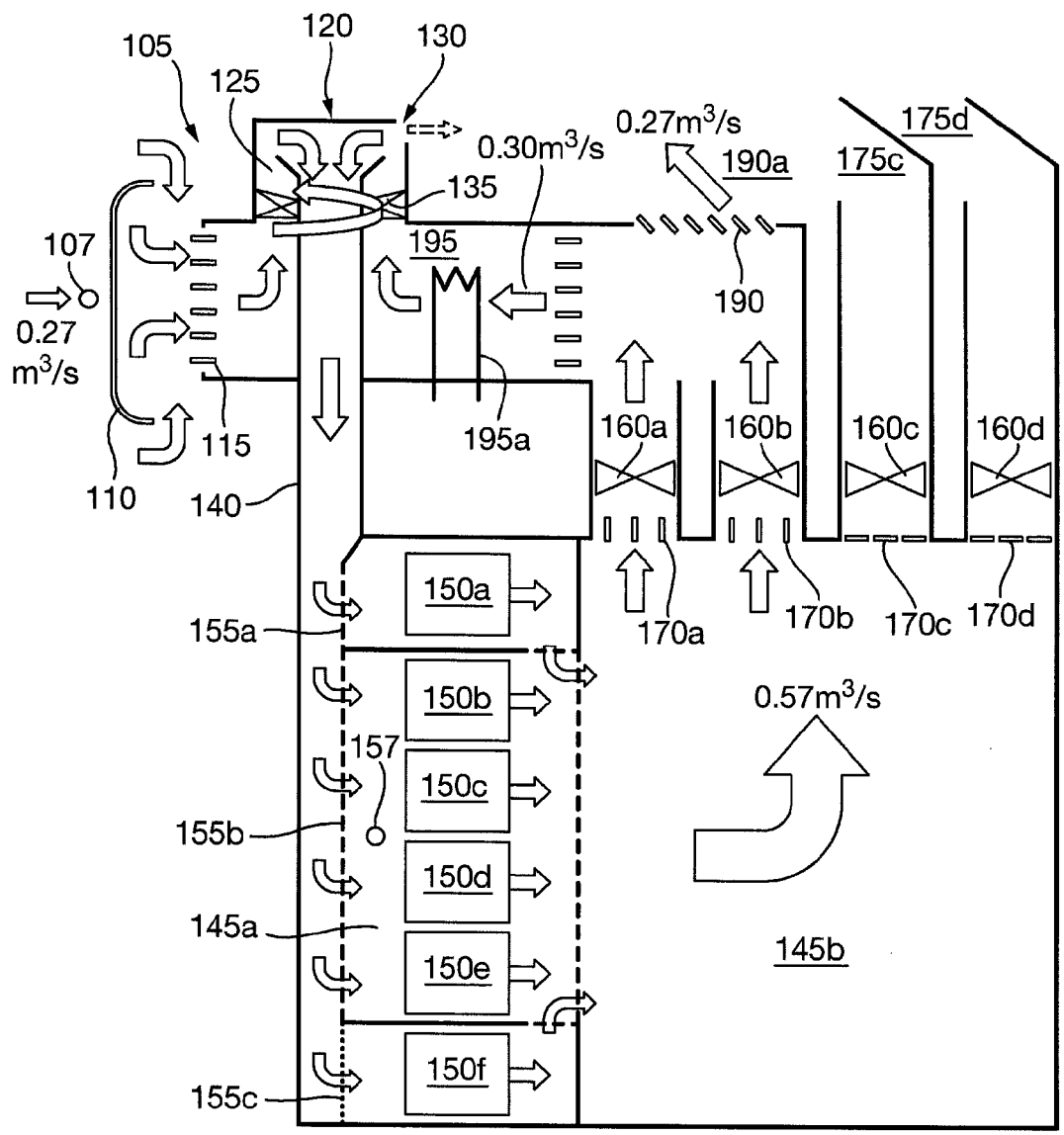
FIG. 3 illustrates the operation of the cooling system of FIG. 1 in a second mode of operation.

Referring initially to FIG. 3, the radar system is operational and in a full transmit power mode. However, in this case, the air temperature at the inlet 105 as sensed by sensor 107 is between −20° C. and 5° C. Whilst the elements 150*a*, 150*b*, 150*c*, 150*d*, 150*e*, 150*f* still need to be cooled, it is not possible to use air directly from the inlet 105 as this may cause them to ice up and prevent optimal operation of the radar system. Fans 160*c*, 160*d* are non-operational and hence their associated backflow shutters 165*c*, 165*d* are closed. Fans 160*a*, 160*b* provide an air flow rate of 0.57 m³s⁻¹ of which 0.30 m³s⁻¹ is recirculated through the cooling apparatus 100 via heating chamber 195.

Here, the inlet shutter 115 is fully open and the exit shutter 190 is partially closed, in a first intermediate position, so that a flow rate of 0.27 m³s⁻¹ is achieved through the exit shutter 190. Bypass shutter 185 is fully open so that a flow rate of 0.30 m³s⁻¹ passes through heating chamber 195 so that the air is heated and mixed with cold air coming in at the inlet 105, in the air cleaning system 120, prior to the mixed air passing through conduit 140 and into plenum chamber 145 to cool the elements 150*a*, 150*b*, 150*c*, 150*d*, 150*e*, 150*f*. The temperature of the air sensed by sensor 157 is between 5° C. and 30° C. which is warm enough to prevent icing up of the elements 150*a*, 150*b*, 150*c*, 150*d*, 150*e*, 150*f*.

Due to the lower flow rate of 0.57 m³s⁻¹ through the cooling apparatus 100, the heater 195*a* can adequately heat the air passing through the heating chamber 195 so that the air temperature at the sensor 157 is at least 5° C. As the exit shutter 190 is in the first intermediate position, the flow rate of the air exiting exit shutter 190 into outlet 190*a* is 0.27 m³s⁻¹ and the flow rate of the air entering the inlet 105 is also 0.27 m³s⁻¹ to maintain a fixed flow rate of 0.57 m³s⁻¹ through the cooling apparatus 100.

Figure 4:
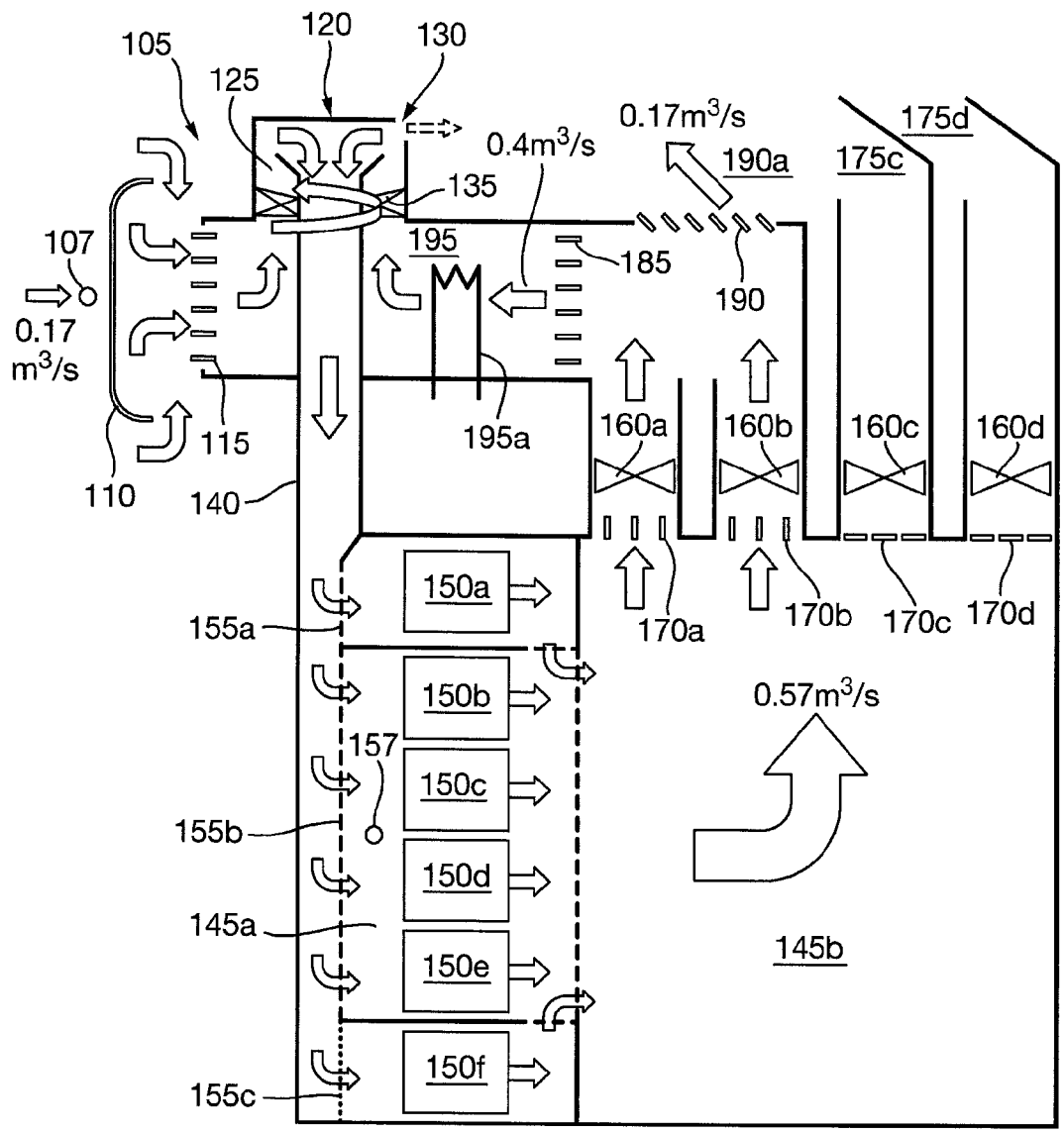
FIG. 4 illustrates the operation of the cooling system of FIG. 1 in a third mode of operation.

If the ambient air temperature is lower than −20° C., for example, between −46° C. and −20° C., the cooling apparatus 100 is arranged as shown in FIG. 4. Again, it is not possible to use air directly from the inlet 105 as this may cause the elements 150*a*, 150*b*, 150*c*, 150*d*, 150*e*, 150*f* to ice up and prevent optimal operation of the radar system. As with the embodiment described with reference to FIG. 3, fans 160*c*, 160*d* are non-operational and hence their associated backflow shutters 165*c*, 165*d* are closed. Fans 160*a*, 160*b* provide an air flow rate of 0.57 m³s⁻¹ of which 0.40 m³s⁻¹ is re-circulated through the cooling apparatus 100 via heating chamber 195.

Here, the inlet shutter 115 is fully open and the exit shutter 190 is partially closed, in a second intermediate position, so that a flow rate of 0.17 m³s⁻¹ is achieved through the exit shutter 190. Bypass shutter 185 is fully open so that a flow rate of 0.40 m³s⁻¹ passes through heating chamber 195 so that the air is heated and mixed with cold air coming in at the inlet 105, in the air cleaning system 120, prior to the mixed air passing through conduit 140 and into plenum chamber 145 to cool the elements 150*a*, 150*b*, 150*c*, 150*d*, 150*e*, 150*f*. The temperature of the air sensed by sensor 157 is between 5° C. and 31° C. which is warm enough to prevent icing up of the elements 150*a*, 150*b*, 150*c*, 150*d*, 150*e*, 150*f*.

Due to the lower flow rate of 0.57 m³s⁻¹ through the cooling apparatus 100, the heater 195*a* can adequately heat the air passing through the heating chamber 195 so that the air temperature at the sensor 157 is at least 5° C. As the exit shutter 190 is in the second intermediate position, the flow rate of the air exiting exit shutter 190 into outlet 190*a* is 0.17 m³s⁻¹ and the flow rate of the air entering the inlet 105 is also 0.17 m³s⁻¹ to maintain a fixed flow rate of 0.57 m³s⁻¹ through the cooling apparatus 100.

Figure 5:
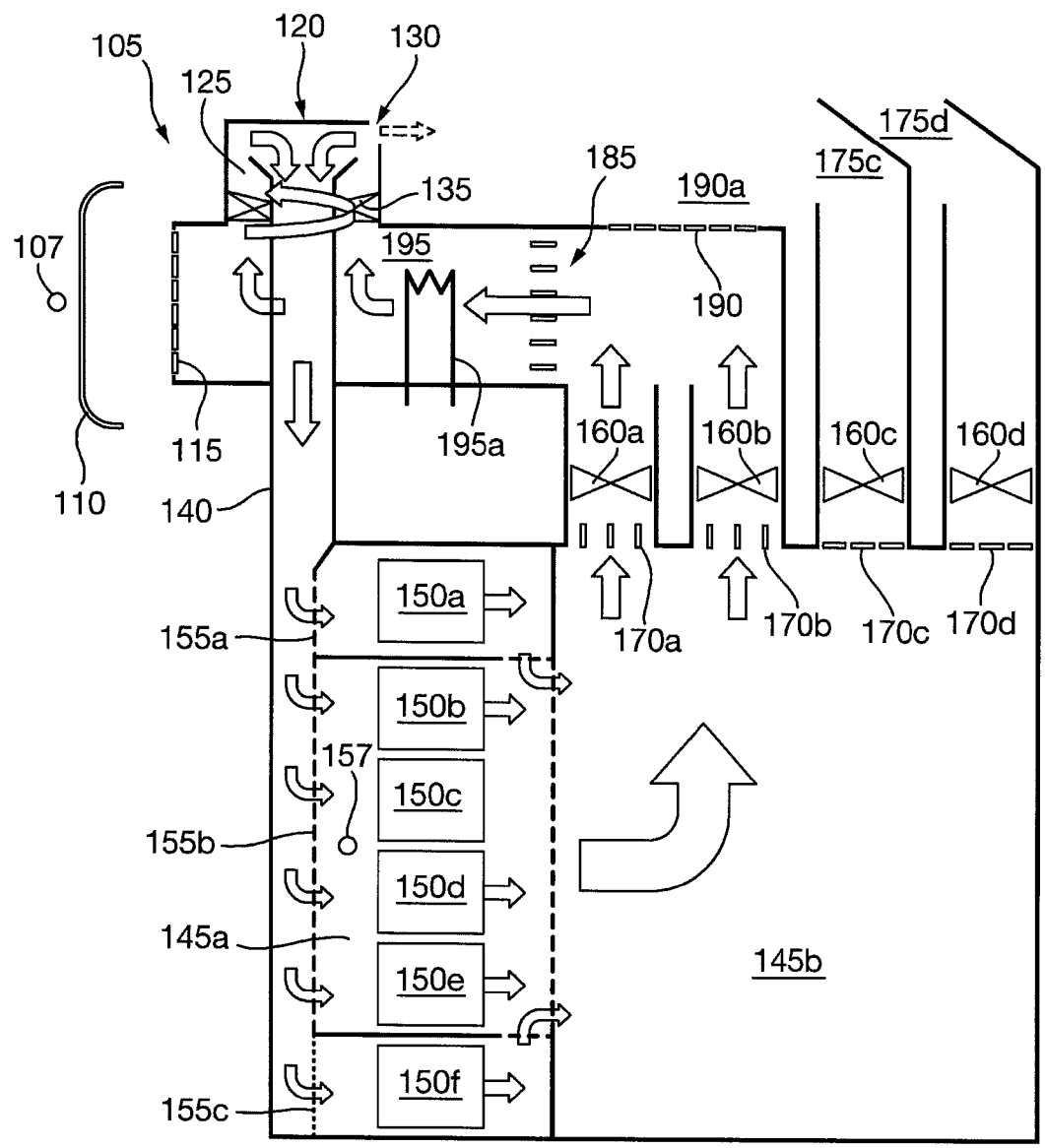
FIG. 5 illustrates the operation of the cooling system of FIG. 1 in a fourth mode of operation.

In addition to the operational arrangements of the cooling apparatus 100 as described with reference to FIGS. 3 and 4, the cooling apparatus 100 can operate in a "pre-heat" mode as shown in FIG. 5. The "pre-heat" mode is used where the radar system has not been operational for some time so that no heat is being generated by the elements 150*a*, 150*b*, 150*c*, 150*d*, 150*e*, 150*f* and the ambient air temperature has fallen below 5° C. Here, before powering up the radar system, it is necessary to bring the air temperature up to a suitable temperature for operation of the radar system.

In FIG. 5, the fans 160*c*, 160*d* are non-operational and hence their associated backflow shutters 165*c*, 165*d* are closed. Fans 160*a*, 160*b* provide a suitable air flow rate which re-circulated through the cooling apparatus 100 via heating chamber 195.

Here, the inlet shutter 115 and exit shutter 190 are both fully closed and the bypass shutter 185 is fully open so all the air in the apparatus 100 passes through heating chamber 195 so that the air is heated. In this case, as the inlet shutter 115 is closed, there is no incoming cold air to be mixed with the warm air from the heating chamber 195 in the air cleaning system 120 and the warm air circulates within the apparatus 100, being heated as it passes through the heating chamber 195, until the temperature sensed by sensor 157 is between 5° C. and 45° C. At this point, the inlet shutter 115 can be opened and the radar system made operational. Subsequent operation of the cooling apparatus 100 is as described above with reference to FIG. 2.

In the "pre-heat" mode, the heater 195*a* operates on a thermostat so that the air does not become overheated.

Figure 6:
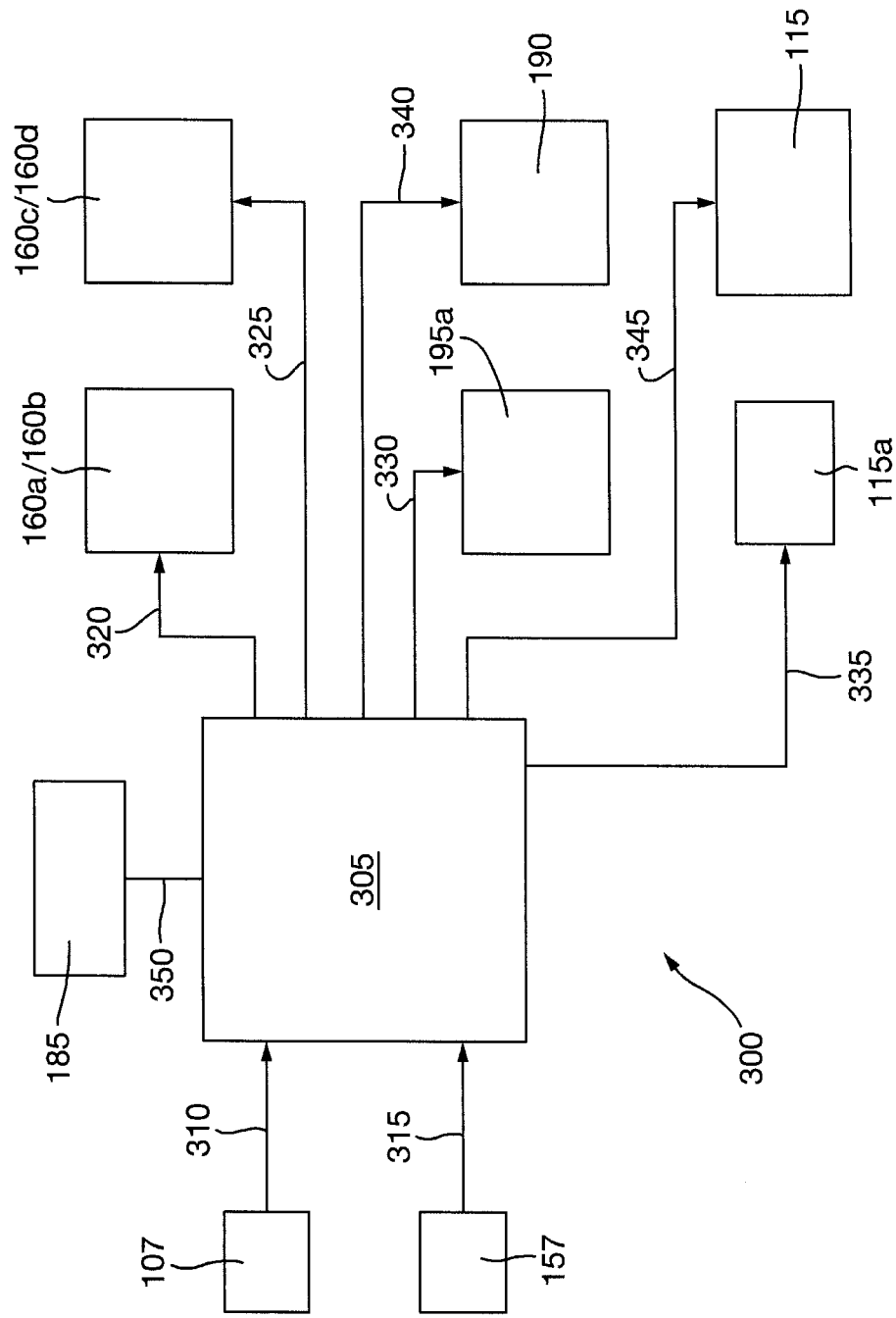
FIG. 6 is a block diagram of the control system for the cooling system of FIGS. 1 to 5.

FIG. 6 illustrates a block diagram of a control system 300 for use with the cooling system of FIGS. 1 to 5. The control system 300 comprises a control unit 305 connected to receive ambient temperature signals 310 from temperature sensor 107 located at the air inlet 105 and operating temperature signals 315 from temperature sensor 157 located in the plenum chamber 145*a*. The control unit 305 uses the temperature signals 310, 315 to control operation of fans 160*a*, 160*b*, 160*c*, 160*d*, heater 195*a*, outlet shutter 190, inlet shutter 115, bypass shutter 185 and anti-icing heating elements 115*a*.

Control signals are sent to fans 160*a*, 160*b* along line 320 and to fans 160*c*, 160*d* along line 325. As described above, fans 160*a*, 160*b* operate as a pair and fans 160*c*, 160*d* operate as another pair. As the fans 160*a*, 160*b*, 160*c*, 160*d* operate in pairs, two control signals 320, 325 can be used. However, it will be appreciated that individual control signals may be sent to each fan 160*a*, 160*b*, 160*c*, 160*d* individually.

Heater 195*a* receives control signals along line 330 and anti-icing heating elements 115*a* receives control signals along line 335. As discussed above, the control unit 305 may control the operation of the heater 195*a* and the anti-icing heating elements 115*a* so that they operate together when required. Alternatively, the control unit 305 may control the operation of the heater 195*a* separately to that of the anti-icing heating elements 115*a*.

Exit shutter 190 receives control signals along line 340 to control whether it is closed, fully open, or in an intermediate position as discussed above. The exit shutter 190 effectively controls the air flow out exiting the cooling apparatus 100 (FIGS. 1 to 5).

Inlet shutter 115 receives control signals along line 345 to control whether it is fully open or fully closed. Inlet shutter 115 is controlled to balance the air flow within the cooling apparatus 100 as described above with reference to FIGS. 1 to 5.

Control signals are sent to the bypass shutter 185 along line 350 to control the air flow through the heater chamber 195 and hence over the heater 195*a* as described above with reference to FIGS. 1 to 5.

Although the present invention has been described with reference to an air cleaning system 120 that includes at least one cyclonic filter 125, it will be appreciated that other types of filters can be used depending on the particular cooling application to which the apparatus 100 is to be applied.

The first and second intermediate positions of the outlet shutter 190 can be such that the outlet shutter is open about two-thirds and one-third respectively of the fully open position. Naturally, these intermediate positions can be adjusted to suit the particular cooling application.

In another embodiment of the invention, the items to be cooled may comprise a plurality of modules, each module having a heat exchanger attached thereto. In this case, the cooling apparatus 100 operates to pull air through or over the heat exchangers to effect cooling of the modules.

The apparatus of the present invention is scalable in that the arrangement described with reference to FIGS. 1 to 5 can form one layer of a stack where each layer cools a plurality of elements so that a two-dimensional array of items to be cooled can be cooled.

It will be appreciated that any connections needed to the elements 150*a*, 150*b*, 150*c*, 150*d*, 150*e*, 150*f* within the cooling apparatus 100, or to components forming part of the cooling apparatus itself, can be made by in any suitable manner as is well known.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

It should be understood that the specific values, e.g. for flow rates given above, are specific examples and broader ranges of values in place of these specific values may be substituted.

The invention claimed is:

1. Ambient air cooling apparatus for a radar array comprising:
   - a plenum chamber having a first portion and a second portion, the first portion containing radar array elements to be cooled, the second portion having at least one first air outlet;
   - an air inlet including an inlet shutter and a baffle for controlling the ingress of air into the cooling apparatus, said inlet shutter being powered and movable between a fully open position and a fully closed position;
   - a heater mounted in a heater chamber for heating air moving within said cooling apparatus from the second portion to the first portion of the plenum chamber;
   - an intermediate chamber defined by a bypass shutter separating the intermediate chamber and the heater chamber, a first pair of fans separating the intermediate chamber from the second portion of the plenum chamber, a first wall positioned between the bypass shutter and a second wall of the intermediate chamber, the first wall having a second air outlet and an outlet shutter spaced from the bypass shutter and the second wall, the first pair of fans being arranged to draw air through said plenum chamber over the radar array elements to be cooled and into the intermediate chamber;
   - a second pair of fans arranged to draw air through said plenum chamber over the radar array elements to be cooled and to said at least one first outlet;
   - said bypass shutter being powered and movable between a fully closed position and a fully open position, the outlet shutter being powered and movable between a fully closed position, a fully open position, and at least one intermediate position in order to control the flow rate of air recirculating in the apparatus from the intermediate chamber into the heater chamber, each of said first and second pairs of fans having a backflow shutter that closes when the fans are non-operational, the backflow shutters of the second pair of fans being configured to close to recirculate all the air entering the air inlet into the intermediate chamber;
   - a first sensor located adjacent said baffle for determining the temperature of air at said air inlet and a second sensor located in said first portion for determining the temperature of air passing over the radar elements; and
   - a controller configured to control the operation of said heater, said inlet shutter, said outlet shutter, said bypass shutter, said first and second pairs of fans and said backflow shutters in order to control a flow rate of air recirculating through the heater chamber based on the temperature of ambient air entering the cooling apparatus and the temperature of the air passing over the radar elements.

2. Apparatus according to claim 1, further comprising a filter attached to said air inlet for filtering the incoming air.

3. Apparatus according to claim 2, wherein said filter comprises a cyclonic filter.

4. Apparatus according to claim 3, wherein said filter also operates to mix heated air from said heater with air from said air inlet.

5. Apparatus according to claim 1, wherein said outlet shutter is powered and can be moved between one of four positions, a fully closed position, a fully open position, a first intermediate position and a second intermediate position.

6. Apparatus according to claim 1, wherein said controller is operable for receiving signals from said first and second sensors and for controlling said inlet shutter, said outlet shutter, said bypass shutter, said heater and said fans in accordance with said signals, in order to match the flow rate through the outlet shutter to the flow rate entering the inlet shutter.

7. Apparatus according to claim 1, further including more than one inlet to said chamber, said inlets being different for balancing air flow over said radar array elements to be cooled.

* * * * *